US012744530B2

(12) United States Patent
Young et al.

(10) Patent No.: US 12,744,530 B2
(45) Date of Patent: Sep. 22, 2026

(54) VEHICLE ELECTRICAL SWITCH ASSEMBLY

(71) Applicant: NISSAN NORTH AMERICA, INC., Franklin, TN (US)

(72) Inventors: Steven Young, Ypsilanti, MI (US); Nelson Phan, Rochester Hills, MI (US)

(73) Assignee: NISSAN NORTH AMERICA, INC., Franklin, TN (US)

( * ) Notice: Subject to any disclaimer, the term of this patent is extended or adjusted under 35 U.S.C. 154(b) by 387 days.

(21) Appl. No.: 18/364,426

(22) Filed: Aug. 2, 2023

(65) Prior Publication Data

US 2025/0047282 A1 Feb. 6, 2025

(51) Int. Cl.

*H03K 17/96* (2006.01)
*B60R 16/00* (2006.01)
*B60R 16/02* (2006.01)
*H01H 3/16* (2006.01)
*H01H 9/02* (2006.01)

(52) U.S. Cl.

CPC ......... *H03K 17/962* (2013.01); *B60R 16/005* (2013.01); *B60R 16/0207* (2013.01); *H01H 3/16* (2013.01); *H01H 9/0271* (2013.01)

(58) Field of Classification Search

CPC .. H01H 2003/127; H01H 63/34; H01H 13/00; H01H 13/10; H01H 13/14; H01H 13/04; H01H 13/06; H01H 3/16; H01H 9/0271; H01H 2021/225; H01H 2300/01; H01H 21/08; H01H 2223/004; H01H 23/06; H01H 19/14; H01H 2025/048; H01H 21/22; H01H 21/24; H01H 2239/006; H01H 9/047; E05F 15/689; G05G 5/03; B60K 35/10; B60K 2360/131; B60K 2360/785; B60K 2360/794; B60K 35/25; B60K 35/60; B60R 16/00; B60R 16/005; B60R 16/02; B60R 16/0207; H03K 17/962

USPC .......................................................... 200/600

See application file for complete search history.

(56) References Cited

U.S. PATENT DOCUMENTS

| | | | | |
|---|---|---|---|---|
| 5,051,607 | A * | 9/1991 | Dalton .................. | H01H 43/00 323/323 |
| 11,364,885 | B2 | 6/2022 | Viele | |
| 2021/0194483 | A1 * | 6/2021 | Cannon .................. | G06F 3/016 |
| 2022/0332342 | A1 | 10/2022 | Leang et al. | |
| 2024/0025361 | A1 * | 1/2024 | Salter ...................... | B60R 16/03 |

FOREIGN PATENT DOCUMENTS

| | | |
|---|---|---|
| DE | 19953863 C2 | 7/2003 |

* cited by examiner

*Primary Examiner* — Anthony R Jimenez

(74) *Attorney, Agent, or Firm* — Spencer Fane, LLP

(57) ABSTRACT

A vehicle electrical switch assembly includes an adaptor and a switch component. The adaptor has an end with a first height and a first width and an end face. The adaptor also has a first depth dimensioned such that the adaptor can be installed in a pre-existing opening of a switch bank of a vehicle. The switch component has a housing and a switch device within the housing. The housing has second height, a second width and a second depth. The second height is greater than the first height and the second width is greater than the first width such that with the switch component installed to the adaptor, the switch component completely covers the end face.

20 Claims, 8 Drawing Sheets

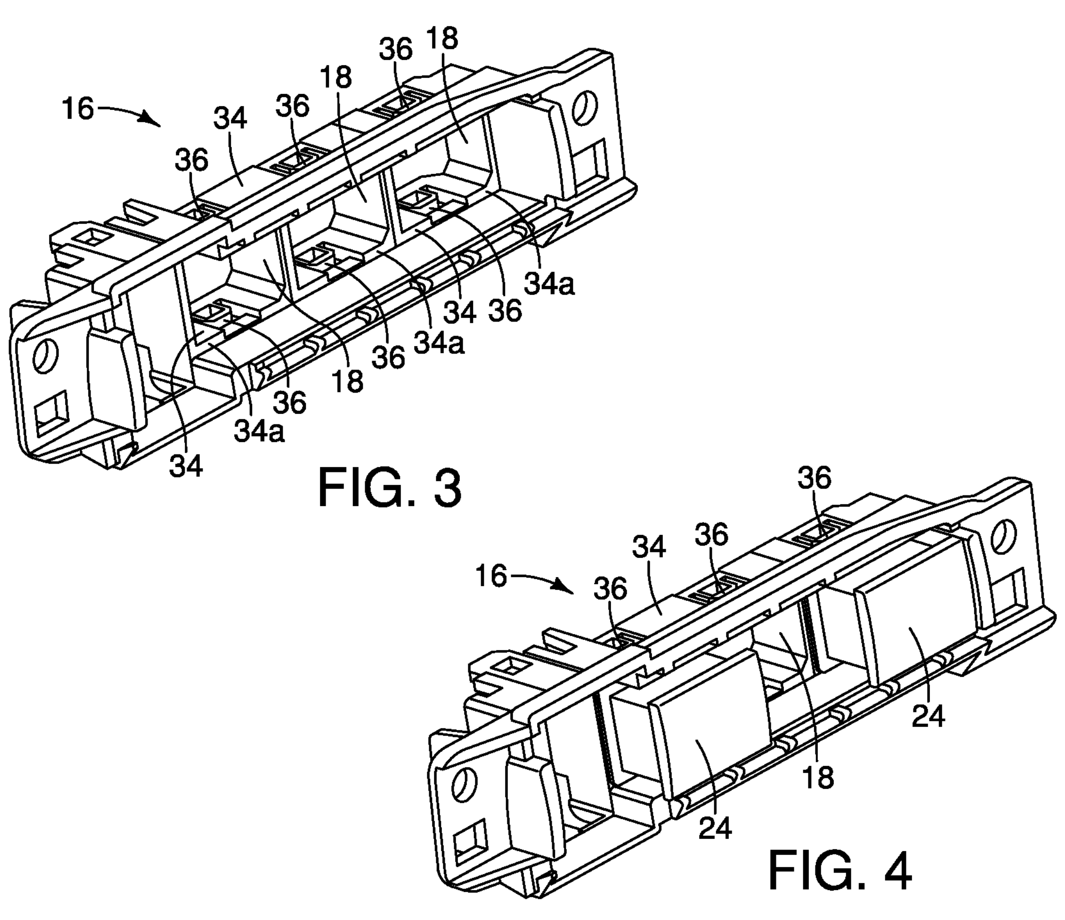
FIG. 3
FIG. 4
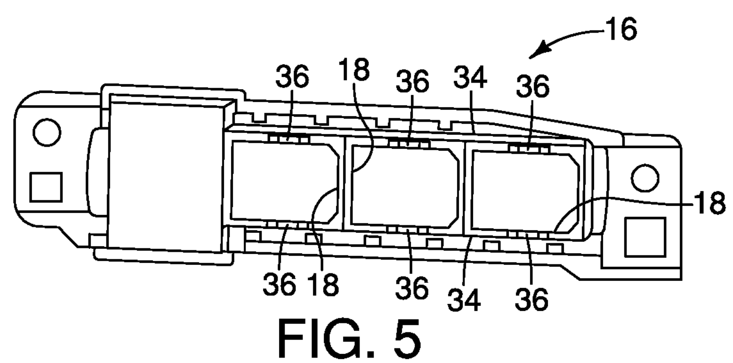
FIG. 5
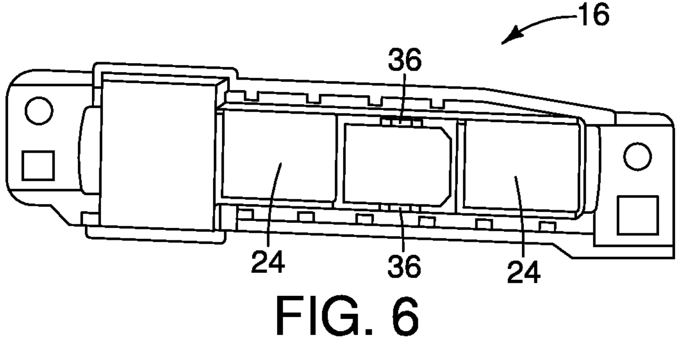
FIG. 6

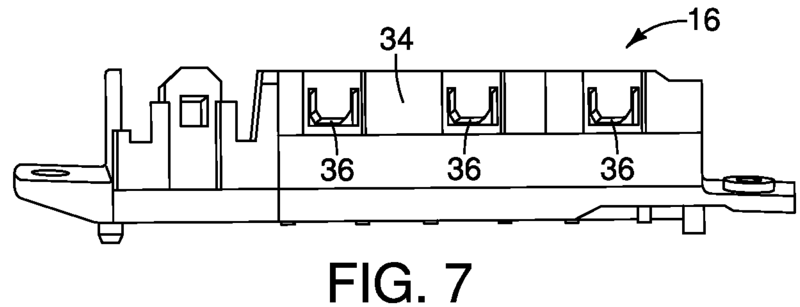
FIG. 7
FIG. 8
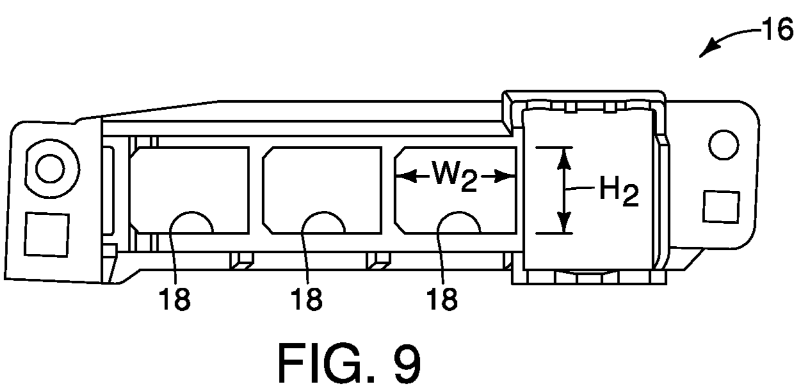
FIG. 9
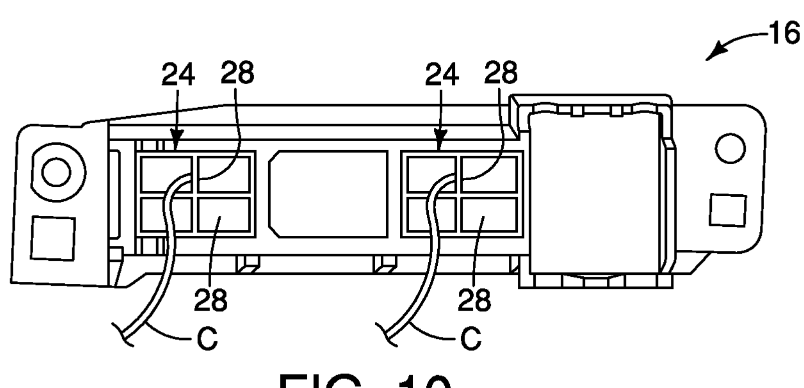
FIG. 10

VEHICLE ELECTRICAL SWITCH ASSEMBLY

BACKGROUND

Technical Field

The present disclosure generally relates to a vehicle electrical switch assembly. More specifically, the present disclosure relates to a vehicle electrical switch assembly that includes a switch component attached to an adaptor dimensioned to fit into an opening of a switch bank installed within a vehicle.

Background Information

Vehicle manufacturers typically provide certain vehicle models with a switch bank that is dimensioned to receive electrical switches that operate electrically powered devices on or within the vehicle. The switch bank usually includes a plurality of openings for electrical switches. Often, one or more of these openings includes an electrical switch leaving several of the openings empty for installation of dealer installed or after-market electric switches for corresponding add-on features to the vehicle.

SUMMARY

One object of the present disclosure is to provide a switch component with an adaptor to facilitate installation to a vehicle switch bank without the need for modification to the switch bank or instrument panel of a vehicle.

In view of the state of the known technology, one aspect of the present disclosure is to provide a vehicle electrical switch assembly with an adaptor and a switch component. The adaptor has an end with a first height and a first width and an end face. The adaptor also has a first depth dimensioned such that the adaptor can be installed in a pre-existing opening of a switch bank of a vehicle. The switch component has a housing and a switch device within the housing. The housing has second height, a second width and a second depth. The second height is greater than the first height and the second width is greater than the first width such that with the switch component installed to the adaptor, the switch component completely covers the end face.

BRIEF DESCRIPTION OF THE DRAWINGS

Referring now to the attached drawings which form a part of this original disclosure:

FIG. 3 is a perspective view of the switch bank removed from the instrument panel and with all switches removed therefrom in accordance with the first embodiment;

FIG. 4 is another perspective view of the switch bank removed from the instrument panel and two switches installed therein in accordance with the first embodiment;

FIG. 5 is a front view of the switch bank removed from the instrument panel and with all switches removed therefrom in accordance with the first embodiment;

FIG. 6 is another front view of the switch bank removed from the instrument panel and two switches installed therein in accordance with the first embodiment;

FIG. 7 is a top view of the switch bank removed from the instrument panel and with all switches removed therefrom in accordance with the first embodiment;

FIG. 8 is another top view of the switch bank removed from the instrument panel and two switches installed therein in accordance with the first embodiment;

FIG. 9 is a rear view of the switch bank removed from the instrument panel and with all switches removed therefrom in accordance with the first embodiment;

FIG. 10 is another rear view of the switch bank removed from the instrument panel and two switches installed therein in accordance with the first embodiment;

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
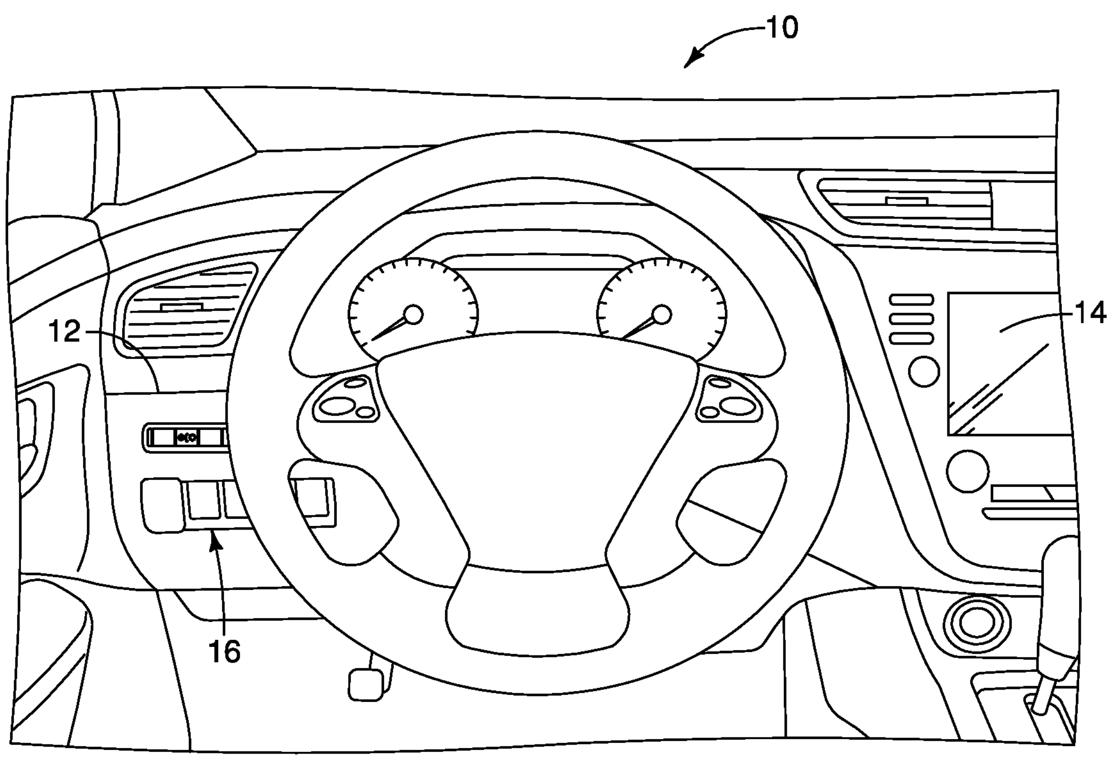
FIG. 1 is a view of a portion of a passenger compartment of a vehicle showing, among other features, a steering wheel and an instrument panel that includes a switch bank with at least one switch in accordance with a first embodiment.

Referring initially to FIG. 1, a vehicle 10 with an instrument panel 12 within a passenger compartment 14 is illustrated in accordance with a first embodiment.

Figure 11:
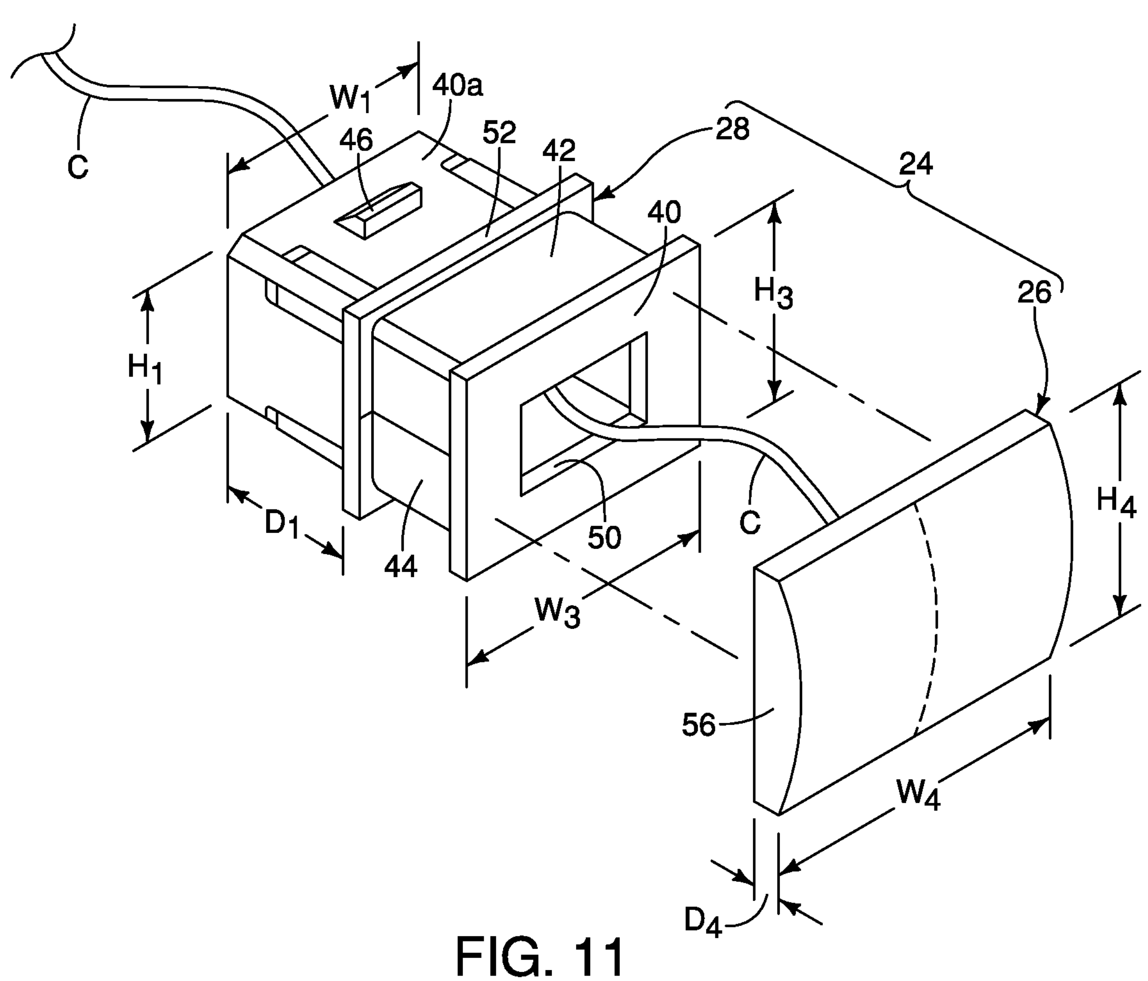
FIG. 11 is an exploded perspective view of a switch assembly removed from the switch bank, the switch assembly having an adaptor and a switch in accordance with the first embodiment.
Figure 12:
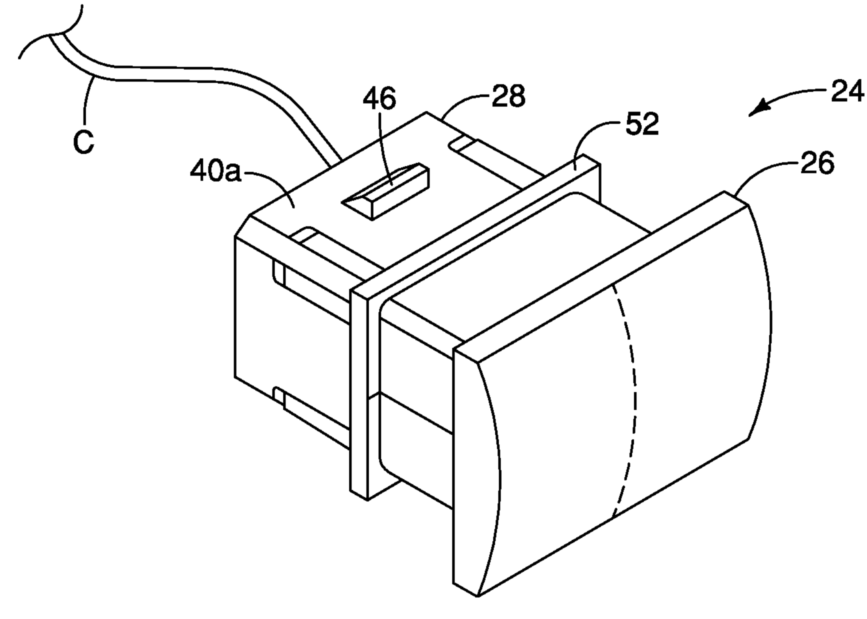
FIG. 12 is a perspective view of the switch assembly removed from the switch bank, with the switch attached to the adaptor of the switch assembly in accordance with the first embodiment.

The instrument panel 12 has a switch bank 16 that includes a plurality of openings 18 that are configured to receive one or more switches, such as conventional switches 20 and a vehicle electric switch assembly 24 (hereinafter referred to as the switch assembly 24). The switch assembly 24 includes a switch component 26 and an adaptor 28, as shown in FIGS. 11 and 12 and described further below.

As shown in FIGS. 2-10, the switch bank 16 is designed to receive any of a variety of switches that operate vehicle devices and/or lights installed to the vehicle 10 in the factory or dealership prior to or during the sale of the vehicle 10. Additionally, one or more of the plurality of openings 18 can be left empty at the time of purchase of the vehicle 10 in order to receive a switch or switches that operates lights and/or other electric devices installed to the vehicle 10 after the original purchase of the vehicle 10.

Figure 2:
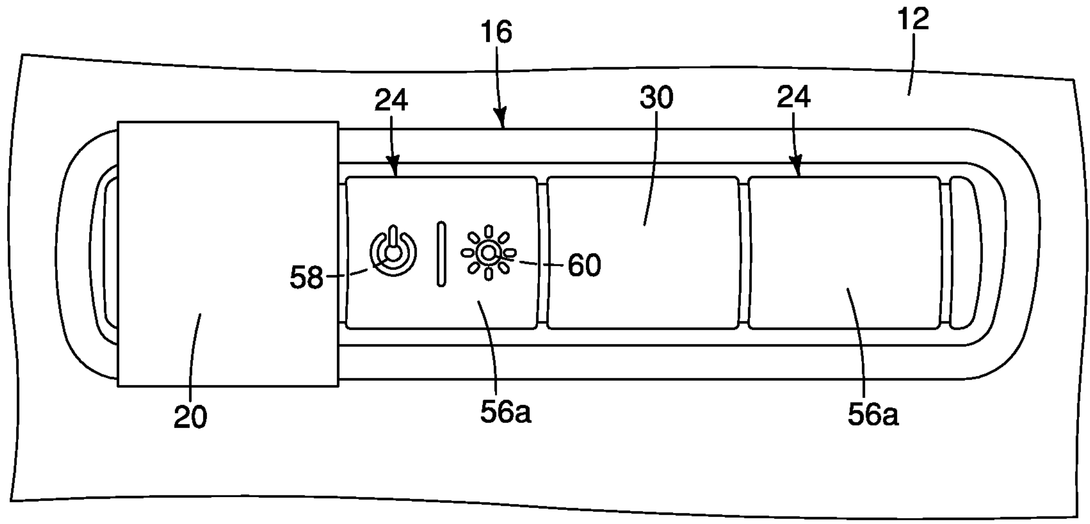
FIG. 2 is a view of the switch bank and at least one switch of the instrument panel in accordance with the first embodiment.

In FIG. 2, the switch bank 16 is shown with one conventional switch 20, a removable cover 30 and two switch assemblies 24. The cover 30 can be removed in order to install another one of the switch assemblies 24 or a conventional switch 20 for operating added lights and/or other added electric devices installed to the vehicle 10.

The conventional switch 20 typically includes mechanical switch elements that can open or close a circuit (not shown) in a conventional manner thereby turning on or turning off a light or mechanism in or on the vehicle. The housing (not shown) of the conventional switch 20 is necessary to retain and support the mechanical elements of the conventional switch 20. In FIG. 2, the conventional switch 20 is slightly larger than the adjacent openings 18. However, it should be understood from the drawings and description herein that the conventional switch 20 can be smaller and dimensioned to fit into any one of the adjacent openings 18. Since conventional switches are well-known in the art, further description is omitted for the sake of brevity.

As shown in FIGS. 3-10, the structure of the switch bank 16 is such that each of the plurality of openings 18 is configured and dimensioned to receive an appropriately sized conventional switch or receive one or more of the switch assemblies 24. The adaptor 28 is similarly dimensioned such that the switch assembly 24 can fit into any one of the plurality of openings 18, as is described in greater detail below.

Each of the openings 18 is at least partially defined by side walls 34 that include projection receiving structures 36 and a stop projection 34*a*. In the depicted example of the switch bank 16, there are three identical openings 18. However, it should be understood that the switch bank 16 can include any number of openings 18 that receive switches. For example, the switch bank 16 can have 2, 3 or more than 4 of the openings 18. FIG. 2 shows the switch bank 16 with the conventional switch 20, two removable covers 30 that cover corresponding ones of the openings 18 and one switch assembly 24.

One of the side walls 34 of the switch bank 16 is shown in FIGS. 3, 4, 7 and 8. Each side wall 34 includes three projection receiving structures 36. Interior walls separate the openings 18 from one another. FIGS. 3, 5, 7 and 9 show the switch bank 16 with all switches removed. FIGS. 4, 6, 8 and 10 show the switch bank 16 is two switch assemblies 24 installed into corresponding ones of the openings 18.

Figure 13:
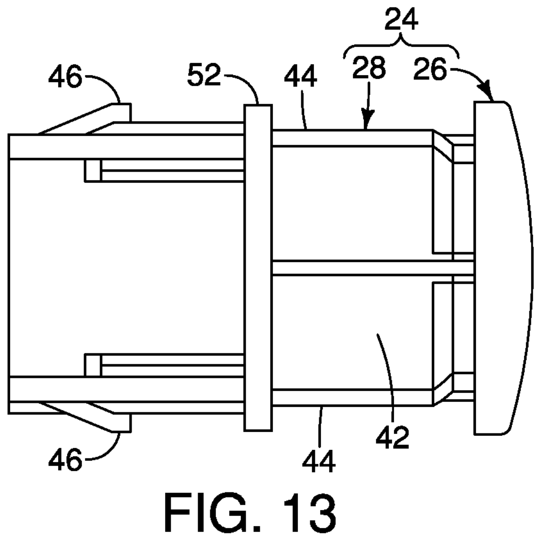
FIG. 13 is a side view of the switch assembly showing snap-fitting projections of the adaptor with the switch fixed to the adaptor in accordance with the first embodiment.
Figure 14:
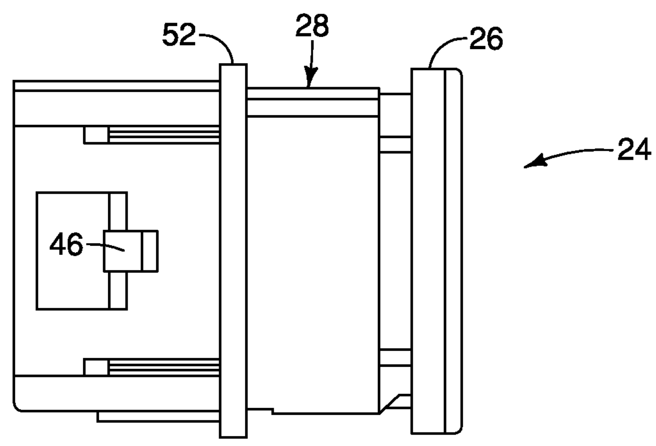
FIG. 14 is a top view of the switch assembly with the switch fixed to the adaptor in accordance with the first embodiment.

As shown in FIGS. 11-13, the switch assembly 24 includes the switch component 26 (hereinafter the switch 26) and the adaptor 28.

The adaptor 28 has an end face 40 and pairs of side walls 42 and 44. Only one side wall 42 and one side wall 44 are visible in FIGS. 11 and 12. The adaptor 28 also defines a first depth $D_1$.

The side walls 42 include at least one snap-fitting projection 46 that is dimensioned and positioned to contact the projection receiving structure 32, as shown in FIGS. 4, 8 and 13. The adaptor 28 is basically hollow. The end face 40 of the adaptor 28 has an opening 50 that receives a cable C of the switch 46.

The adaptor 28 also includes a protrusion 52 that extends all around the perimeter of the adaptor 28. When the adaptor 28 is installed into one of the plurality of openings 18 in the switch bank 16, the snap-fitting projections 46 engage the projection receiving structure 36. The protrusion 52 contacts the stop projection 34*a* within the opening 18. Thus, the stop projection 34*a* of the side wall 34 is contacted by the protrusion 52 within the opening 18 and the snap-fitting projection 46 engages the projection receiving structure 36 thereby retaining the adaptor 28 within the corresponding opening 18. The distal end 40*a* of the adaptor 28 defines a first width $W_1$ and a first height $H_1$, as shown in FIG. 11. As shown in FIG. 9, each opening 18 has a second height $H_2$ and a second width $W_2$. The second height $H_2$ is slightly larger than the first height $H_1$ within conventional engineering tolerances and the second width $W_2$ is slightly larger than the first width $W_1$. For example, the first height $H_1$ is preferably at least 95% of the second height $H_2$. Similarly, the first width $W_1$ is preferably at least 95% of the second width $W_2$. Thus, the adaptor 28 snuggly fits within the opening 18 and is retained in position once installed. The depth $D_1$ is dimensioned such that the end face 10 is attached to the switch 26 (as described below) the switch 26 is either flush with or may protrude several millimeters outward from the adjacent surface of the instrument panel 12.

The end face 40 defines a third height $H_3$ and a third width $W_3$. The third height $H_3$ and the third width $W_3$ are dimensioned such that when the switch bank 16 and switch assemblies 24 are installed to the instrument panel 12, the switch bank 16 is at least partially concealed.

Figure 15:
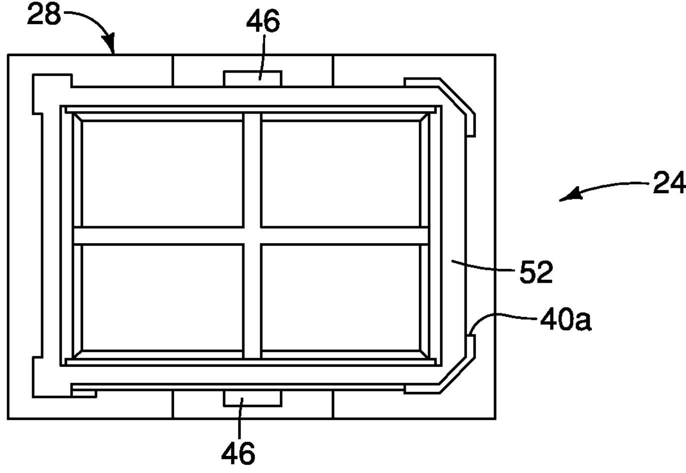
FIG. 15 is a rear view of the switch assembly in accordance with the first embodiment.
Figure 16:
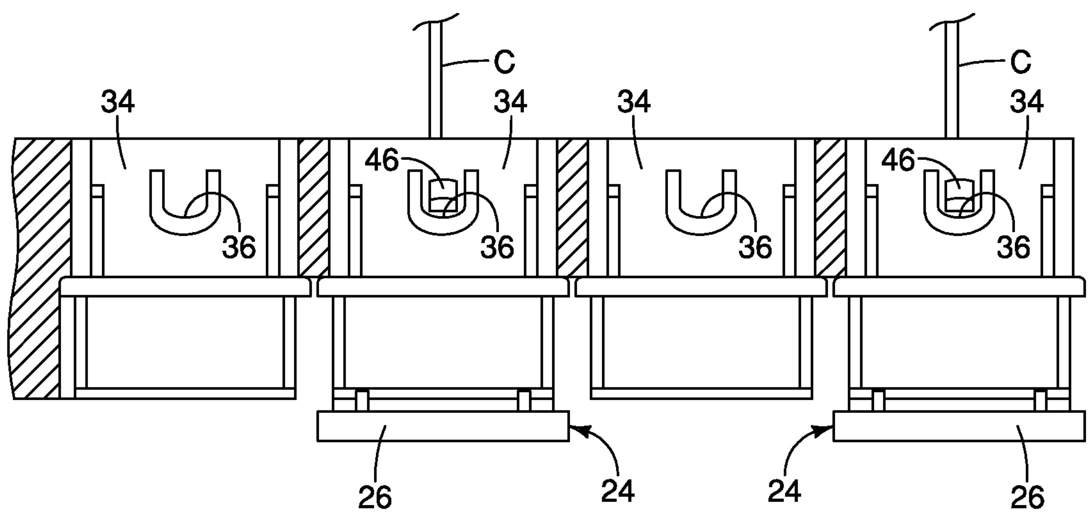
FIG. 16 is a cross-sectional view of the switch bank with two of the switch assemblies installed therein showing projection receiving structures of the switch bank with the snap-fitting projections of the adaptor engaged therewith in accordance with the first embodiment.

A description of the switch 26 of the switch assembly 24 is now provided with specific reference to FIGS. 11-13 and 15. As shown in FIG. 15, the switch 26 has a housing 56, a first switch device 58 and a second switch device 60 within the housing 56. The housing 56 of the switch 26 defines a fourth height $H_4$, a fourth width $W_4$ and a fourth depth $D_4$. The fourth height $H_4$ is at least the same as or greater than the third height $H_3$ and the fourth width $W_4$ is at least the same as or greater than larger than the third width $W_3$. Thus, when the switch assembly 24 is installed to the switch bank 16 and the switch bank 16 is installed to the instrument panel 12, the switch bank 16 is further covered and concealed. Preferably, the switch 26 completely covers the end face 40 of the adaptor 28.

The fourth depth $D_4$ is much smaller than the depth $D_1$. Specifically, the switch 26 is not deep but rather is a very thin member that is significantly smaller than the adapter 28, as measured relative to depth. Preferably, the fourth depth $D_4$ is than 10% of the depth $D_1$ or less.

The housing 56 covers and protects the first switch device 58 and the second switch device 60. The first switch device 58 and the second switch device 60 are fixed to a printed circuit board assembly 64 (hereinafter the PCBA 64). The PCBA 64 is surrounded and encased within a silicon case or membrane 66. LED lights are embedded in or on the PCBA 64 that provide backlighting for the switch 26. Hence, the housing 56 can be translucent or at least partially transparent allowing illumination by the LED lights to pass at least partially therethrough. The PCBA 64 is mounted to a rigid backing material 68 that is also covered by the housing 56.

The housing 56 further surrounds and protects the first switch device 58 and the second switch device 60 which are attached to the PCBA 64. The housing 56 can be made of any of a variety of materials such that the exposed portion 56*a* of the housing 56 shown in FIG. 2 is flexible. The remainder of the housing 56 can be made from more rigid materials or the same flexible material as the exposed portion 56*a*. The housing 56 attaches to the end face 40 of the adaptor 28 via an adhesive material, double side tape or mechanical fasteners (not shown). Preferably, an adhesive double-sided tape is used to fix the housing 56 of the switch 26 to the end face 40 of the adaptor 28.

The switch device 58 includes a wiring harness or cable C that extends from a back side of the housing 56 of the switch assembly and through an opening 50 in the end face 40 of the adaptor 28. The adaptor 28 is hollow such that the cable C can pass through the hollow interior of the adaptor 28 and out the back side of the switch bank 16, as shown in FIG. 10. The cable C further connects the switch assembly 24 a wiring harness (not shown) of the vehicle 10 and subsequently attached to a controller 86, as shown schematically in FIG. 17.

Figure 17:
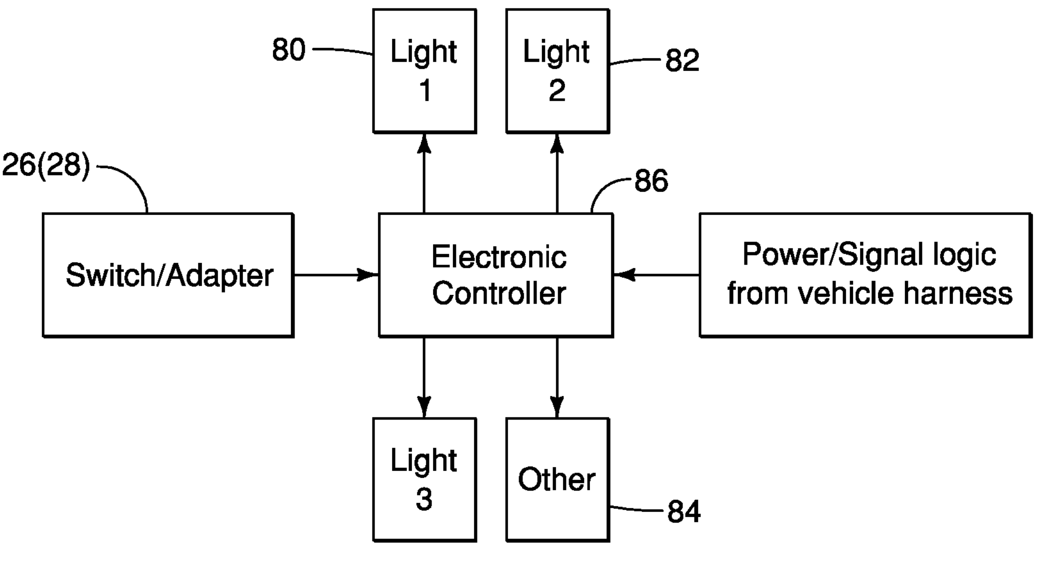
FIG. 17 is an block diagram of an electronic controller connected to the switch assemblies and lights controlled by operation of the switch assemblies in accordance with the first embodiment.

As shown in FIG. 17, the switch assembly 24 can be electronically connected to the electronic controller 86 or alternatively can be directly connected to an add-on device such as the light 80 and/or the light 82. The conventional switch 20 can also be electrically connected to the electronic controller 86.

The electronic controller 86 preferably includes a microcomputer with a control program that responds to operation of the switch assembly 24 and/or operation of the conventional switch 20 in order to control the lights 80 and 82, and other devices 84 that may be connected thereto. The electronic controller 86 can also include other conventional components such as an input interface circuit, an output interface circuit, and storage devices such as a ROM (Read Only Memory) device and a RAM (Random Access Memory) device. The electronic controller 86 is capable of selectively controlling any of the components of the vehicle 10 that require human interaction with switches or control mechanism such as the switches.

The switch 26 of the switch assembly 24 includes the first switch device 58 and the second switch device 60. Each of the first and second switch devices 58 and 60 are identical. Therefore, description of one switch device applies equally to the other with respect to operation of each switch device 58 and 60. However, the function of each of the switch devices 58 and 60 differ, as explained below.

Figure 18:
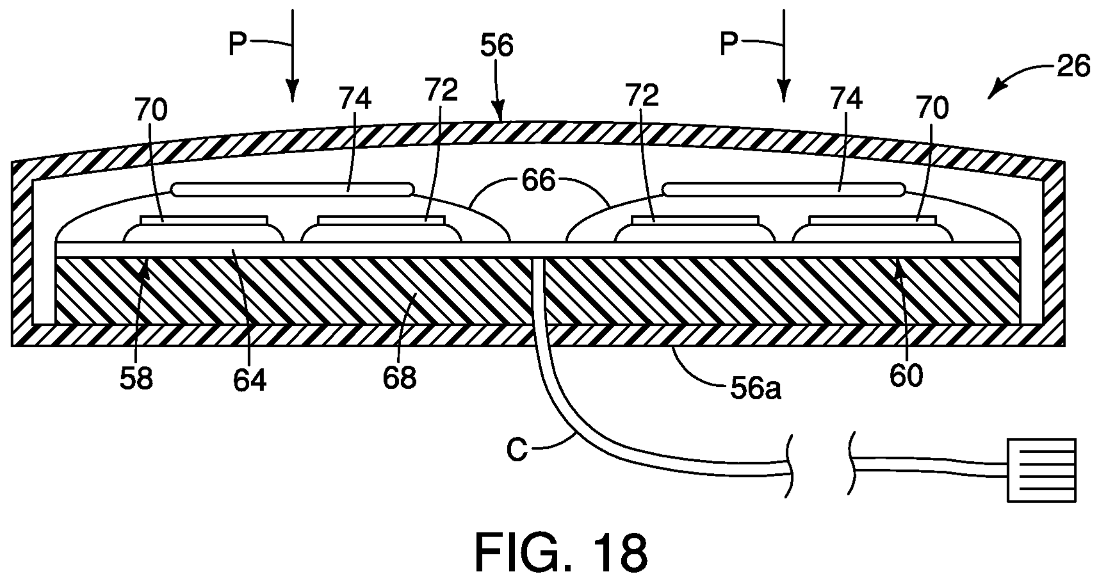
FIG. 18 is a cross-sectional view of one of the switches of the switch assembly showing the internal features of the switch in accordance with the first embodiment.

Each of the switch devices 58 and 60 include a first electrical plate 70, a second electrical plate 72 and a bridging plate 74. The first electrical plate 70 and the second electrical plate 72 are in electronic communication with the cable C via circuitry on the PCBA 64. In the absence of any force being applied to the housing 56, a circuit defined between the first electrical plate 70, a second electrical plate 72 is open (not completed). However, in response to a pressing force P being applied to the exposed surface 56*a* (see FIG. 1) of the housing 56 at the switching device 58, the bridging plate 74 contacts both the first and second electrical plates 70 and 72 completing the circuit. The electronic controller 86 detects the completion of the circuit and toggles one or both of the lights 80 and 82 between one of the on and off state. Pressing a second time on the housing at the bridging plate 74 causes the bridging plate 74 to again contact both the first and second electrical plates 70 and 72 completing the circuit, as shown in FIG. 18. The electronic controller 86 detects the completion of the circuit and toggles one or both of the lights 80 and 82 to the other of an on and off state.

The second switching device 60 operates in the same manner as the first switching device 60 with regard to the application of a pressing force P and completion of the circuit by having the bridging plate 74 contact both the first and second electrical plates 70 and 72. However, the electronic controller 86 responds differently to operation of the second switching device 60. In response to detection of closing of the circuit of the second switching device 60, the electronic controller 86 toggles one or both of the lights 80 and 82 between an array of differing colors, such as, for example, red, green, yellow, magenta, maroon, blue and white, or alternatively, can toggle the lights 80 and 82 through differing levels of brightness. The lights 80 and 82 are, for example, multicolored LED lights.

Hence, with the exposed surface 56*a* of the housing 56 being made of a flexible material, applying a pressing force P to the first portion of the exposed surface 56*a* at the first switch device 58 operates the first switch device 58 and applying a pressing force P on a second portion of the exposed surface 56*a* of the housing 56 operates the second switch device 60.

The switch assembly 24 having the switch devices 58 and 60 being fixed to the adaptor 28 provides many advantages. For example, the switch 26 of the switch assembly 24 can be used without the adaptor 28 in many of a variety of applications, such as, on the instrument panel 12 where no switch bank 16 is present. Another advantage is that since the switch assembly 24 can be easily installed to the switch bank 16, an additional switch assembly 24 or assemblies 24 can be added to a vehicle 10 in order to provide the vehicle 10 with additional functionality. For instance, the lights 80 and 82 can be installed within the vehicle 10 or outside the vehicle 10. The lights 80 and/or 82 can be off-road lamps installed to the roof of the vehicle that illuminate areas forward of the vehicle 10 during off-road usage of the vehicle 10. Alternatively, the lights 80 and/or 82 can be installed within the passenger compartment 14 providing additional passenger lighting. Still further, the lights 80 and/or 82 can be installed to the front of the vehicle 10 serving as fog lamps.

Second Embodiment

Figure 19:
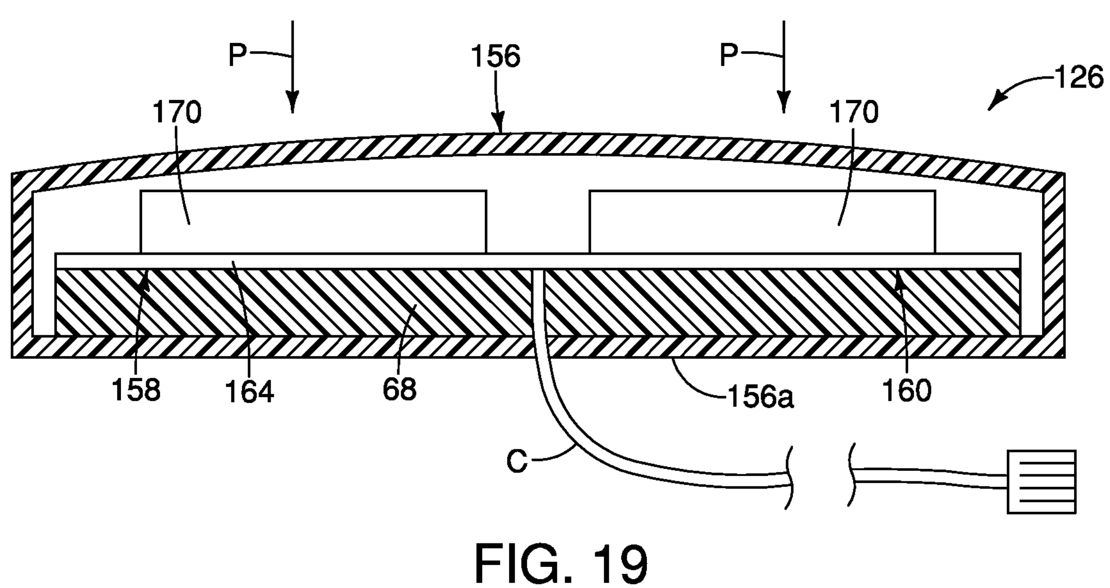
FIG. 19 is a cross-sectional view of one of the switches of the switch assembly showing the internal features of the switch in accordance with a second embodiment.

Referring now to FIG. 19 a switch 126 in accordance with a second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

Like the switch 26 of the first embodiment, the switch 126 of the second embodiment includes a first switch device 158 and a second switch device 160 mounted to a PCBA 164. The PCBA 164 is mounted to the rigid backing material 68. The first switch device 158, the second switch device 160 and the PCBA 164 are all protected and covered by the silicon case or membrane 66.

Each of the first switch device 158 and the second switch device 160 is a capacitive haptic switch that detects the presence of a human finger and sends a signal to the electronic controller 86. Hence, in the second embodiment, a vehicle operator or passenger places their finger on the housing 156 at the first switch device 158 or the second switch device 160 with little or no pressing force P. The capacitance detectors 170 detect the presence of a human finger and sends a corresponding signal to the electronic controller 86.

Third Embodiment

Figure 20:
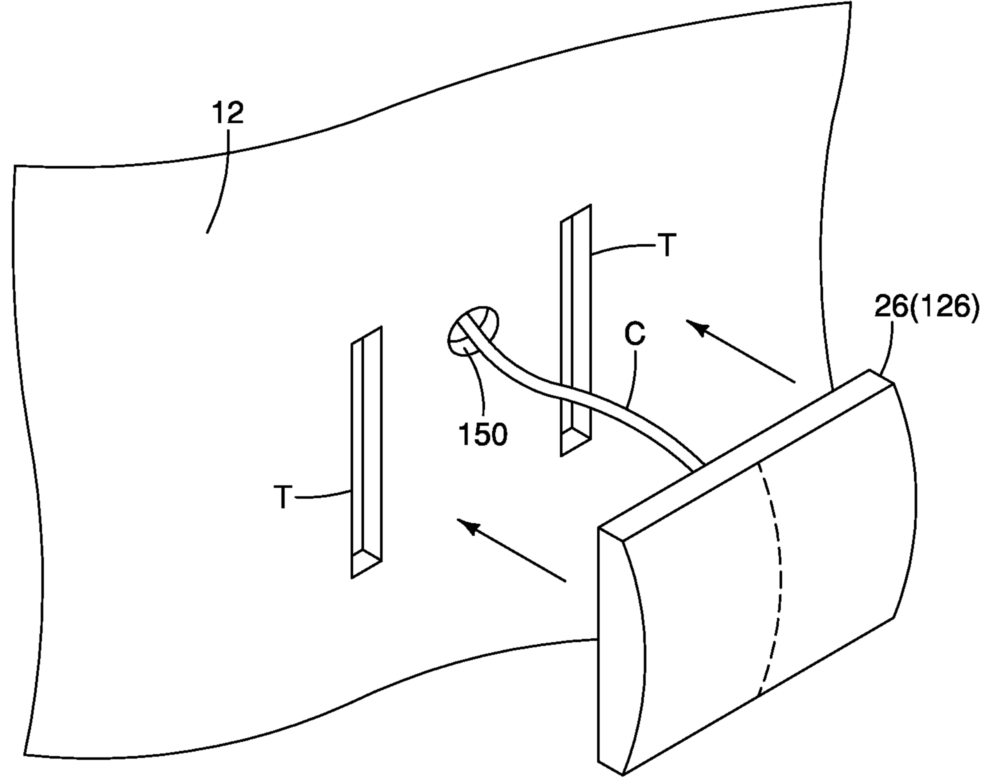
FIG. 20 is a perspective view of the switch during installation of the switch directly to the instrument panel of the vehicle in accordance with a third embodiment.
Figure 21:
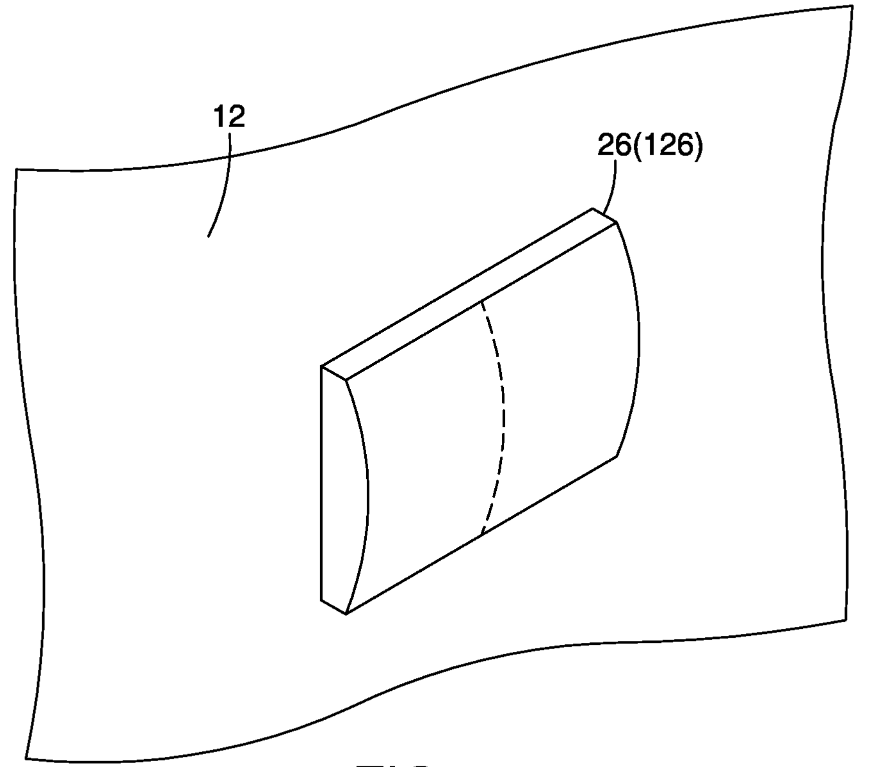
FIG. 21 is another perspective view of the switch installed directly to the instrument panel of the vehicle in accordance with the third embodiment.

Referring now to FIGS. 20 and 21, the switch 26 (and the switch 126) in accordance with a third embodiment will now be explained. In view of the similarity between the first and third embodiments, the parts of the third embodiment that are identical to the parts of the first embodiment will be given the same reference numerals as the parts of the first embodiment. Moreover, the descriptions of the parts of the third embodiment that are identical to the parts of the first embodiment may be omitted for the sake of brevity.

In the third embodiment, the switch 26 (and/or the switch 126) of the first and second embodiments can be employed in the absence of the adaptor 28. Specifically, the switch 26 (or the switch 126) can be installed directly to a portion of the instrument panel 12, or a trim panel in other locations of the vehicle 10.

An opening 150 in the instrument panel 12 is drilled or formed during the manufacturing process of the instrument panel 12. The cable C is inserted through the opening 150 as shown in FIG. 20 and connected to the electronic controller 86 (see FIG. 17) or wiring that is connected to the electronic controller 86. The switch 26 (or the switch 126) is then fixed to an exposed surface of the instrument panel 12 surrounding the opening 150. The switch 26 (or the switch 126) is then directly attached to the instrument panel 12 as shown in FIG. 21 via, for example, double-sided adhesive tape T, mechanical fasteners (not shown) or a suitable adhesive material (not shown).

The various elements of the instrument panel 12 and passenger compartment 14 are conventional components that are well known in the art. Since these elements are well known in the art, these structures will not be discussed or illustrated in detail herein. Rather, it will be apparent to those skilled in the art from this disclosure that the components can be any type of structure and/or programming that can be used to carry out the present invention.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiments, the following directional terms "forward", "rearward", "above", "downward", "vertical", "horizontal", "below" and "transverse" as well as any other similar directional terms refer to those directions of a vehicle equipped with the vehicle electrical switch assembly. Accordingly, these terms, as utilized to describe the present invention should be interpreted relative to a vehicle equipped with the vehicle electrical switch assembly.

The term "configured" as used herein to describe a component, section or part of a device includes hardware and/or software that is constructed and/or programmed to carry out the desired function.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such features. Thus, the foregoing descriptions of the embodiments according to the present invention are provided for illustration only, and not for the purpose of limiting the invention as defined by the appended claims and their equivalents.

What is claimed is:

1. A vehicle electrical switch assembly, comprising an adaptor having an end with a first height and a first width and an end face, the adaptor also having a first depth dimensioned such that the adaptor can be installed in a pre-existing opening of a switch bank of a vehicle; and a switch component having a housing and at least one switch device within and surrounded by at least five sides of the housing, one of the at least five sides of the housing having a second height and a second width, and the housing having a second depth, the second height being greater than the first height and the second width being greater than the first width such that with the switch component installed to the adaptor, the switch component completely covers the end face of the adaptor.

2. The vehicle electrical switch assembly according to claim 1, wherein the second depth of the housing of the switch component is less than 10% of the first depth of the adaptor.

3. The vehicle electrical switch assembly according to claim 1, wherein the adaptor includes a plurality of snap-fitting protrusions configured to engage surfaces that define the pre-existing opening of the switch bank for retention therein.

4. The vehicle electrical switch assembly according to claim 1, wherein the at least one switch device includes a wiring harness that extends from a back side of the switch component and through an opening in the end face of the adaptor such that the at least one switch device can be electrically connected to the vehicle.

5. The vehicle electrical switch assembly according to claim 1, wherein the housing includes a silicon material surrounding the at least one switch device.

6. The vehicle electrical switch assembly according to claim 1, wherein the at least one switch device is fixed to a printed circuit board.

7. The vehicle electrical switch assembly according to claim 1, wherein the at least one switch device includes a first switch and a second switch configured such that pressing on a first portion of an exposed surface of the housing of the switch component operates the first switch and pressing on a second portion of the exposed surface of the housing of the switch component operates the second switch.

8. The vehicle electrical switch assembly according to claim 7, wherein each of the first switch and the second switch includes a pair of electric contact plates, and an exposed surface of the housing is made of a flexible material such that pressing the first portion of the exposed surface operates the first switch and pressing on the second portion of the exposed surface operates the second switch.

9. The vehicle electrical switch assembly according to claim 1, wherein the at least one switch device includes a first switch and a second switch configured such that contacting a first portion of an exposed surface of the housing of the switch component operates the first switch and contacting a second portion of the exposed surface of the housing of the switch component operates the second switch.

10. The vehicle electrical switch assembly according to claim 9, wherein each of the first switch and the second switch is a capacitive haptic switch.

11. A vehicle electrical switch assembly, comprising:

a switch bank of a vehicle, the switch bank having a plurality of openings that are each configured and dimensioned to receive a switch;

an adaptor having an end face with a first height and a first width, the adaptor also having a first depth dimensioned such that the adaptor can be installed in an empty one of the plurality of openings of the switch bank; and a switch component having a housing and at least one switch device within and surrounded by at least five sides of the housing, one of the at least five sides of the housing having a second height and a second width, and the housing having a second depth, the second height being at least approximately the same as or greater than the first height and the second width being at least approximately the same or greater than the first width such that with the switch component installed to the adaptor, the switch component completely covers the end face.

12. The vehicle electrical switch assembly according to claim 11, wherein each of the plurality of openings of the switch bank includes a projection receiving structure, and the adaptor includes at least one snap-fitting projection dimensioned and positioned to contact the projection receiving structure once installed into one of the plurality of openings in the switch bank thereby retaining the adaptor within the one of the plurality of openings.

13. The vehicle electrical switch assembly according to claim 11, wherein the second depth of the housing of the switch component is less than 10% of the first depth of the adaptor.

14. The vehicle electrical switch assembly according to claim 11, wherein the adaptor includes a plurality of snap-fitting protrusions dimensioned to engage surfaces that define each of the plurality of openings of the switch bank for retention therein.

15. The vehicle electrical switch assembly according to claim 11, wherein the at least one switch device includes a wiring harness that extends from a back side of the switch component and through an opening in the end face of the adaptor such that the at least one switch device can be connected to a wiring harness of the vehicle.

16. The vehicle electrical switch assembly according to claim 11, wherein the housing includes a silicon material surrounding the at least one switch device.

17. The vehicle electrical switch assembly according to claim 11, wherein the at least one switch device includes a first switch and a second switch configured such that pressing on a first portion an exposed surface of the housing of the switch component operates the first switch and pressing on a second portion of the exposed surface of the housing of the switch component operates the second switch.

18. The vehicle electrical switch assembly according to claim 17, wherein each of the first switch and the second switch includes a pair of electric contact plates, and an exposed surface of the housing is made of a flexible material such that pressing the first portion of the exposed surface operates the first switch and pressing on the second portion of the exposed surface operates the second switch.

19. The vehicle electrical switch assembly according to claim 11, wherein the at least one switch device includes a first switch and a second switch configured such that contacting a first portion an exposed surface of the housing of the switch component operates the first switch and contacting a second portion of the exposed surface of the housing of the switch component operates the second switch.

20. The vehicle electrical switch assembly according to claim 19, wherein each of the first switch and the second switch is a capacitive haptic switch.

* * * * *